(12) United States Patent
O'Donnell et al.

(10) Patent No.: US 7,939,916 B2
(45) Date of Patent: May 10, 2011

(54) WAFER LEVEL CSP PACKAGING CONCEPT

(75) Inventors: Alan O'Donnell, Castletroy (IE); Oliver Kierse, Killaloe (IE); Thomas M. Goida, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 190 days.

(21) Appl. No.: 11/627,041

(22) Filed: Jan. 25, 2007

(65) Prior Publication Data

US 2008/0179730 A1 Jul. 31, 2008

(51) Int. Cl.
*H01L 23/552* (2006.01)

(52) U.S. Cl. ........ 257/659; 257/435; 257/787; 257/788; 257/E23.117

(58) Field of Classification Search .................. 438/106; 257/435, 788, 659, E23.117
See application file for complete search history.

(56) References Cited

U.S. PATENT DOCUMENTS

| | | | | |
|---|---|---|---|---|
| 6,191,884 B1 * | 2/2001 | Takizawa et al. | ............. | 359/359 |
| 6,528,894 B1 * | 3/2003 | Akram et al. | ................. | 257/788 |
| 6,876,052 B1 * | 4/2005 | Tai | ................. | 257/433 |
| 6,908,784 B1 * | 6/2005 | Farnworth et al. | ............ | 438/106 |
| 7,015,576 B2 * | 3/2006 | Yamane | ......................... | 257/704 |
| 7,224,043 B2 * | 5/2007 | Haeberlen | ..................... | 257/622 |
| 7,271,029 B1 * | 9/2007 | Tai | ................. | 438/107 |
| 2004/0142191 A1 * | 7/2004 | Mei-Yen et al. | ........... | 428/473.5 |
| 2005/0212145 A1 * | 9/2005 | Imoto et al. | .................... | 257/782 |
| 2006/0043364 A1 * | 3/2006 | Jiang et al. | ....................... | 257/48 |
| 2007/0018322 A1 * | 1/2007 | Park et al. | ...................... | 257/738 |
| 2007/0273046 A1 * | 11/2007 | Theuss | ........................... | 257/783 |
| 2008/0064137 A1 * | 3/2008 | O'Donnell | ..................... | 438/106 |

OTHER PUBLICATIONS http://www.fujitsu.com/downloads/micro/fma/pdf/supercsp.pdf
"Super CS". Fujitsu Microelectronics America, Inc. pp. 17-19.

* cited by examiner

*Primary Examiner* — Angel Roman
(74) *Attorney, Agent, or Firm* — Sunstein Kann Murphy & Timbers LLP

(57) ABSTRACT

An electronics package includes a wafer die substrate containing electronic circuits and having a top surface and a bottom surface. A top protective layer is substantially thinner than the substrate and covers the top surface. A bottom protective layer is substantially thinner than the substrate and covers the bottom surface. Circuit contacts are distributed about the bottom protective layer for electrically coupling the substrate electronic circuits to external electronic circuits.

8 Claims, 10 Drawing Sheets

WAFER LEVEL CSP PACKAGING CONCEPT

FIELD OF THE INVENTION

The present invention relates to packages for electronic circuits, and specifically, an encapsulated wafer level chip scale package.

BACKGROUND ART

One constraint on the development of new electronic products is the assembly and packaging of the required circuits. Packaging serves multiple functions including to protect the enclosed circuit die surface and to provide a stress release mechanism between the die and the printed circuit board. In addition, the package needs to be compatible with application requirements for small size, high density, and low cost.

In the past, device packages have been assembled as individual units after wafer slicing of the circuit dies. Such packages are several times the size of the enclosed circuit die. More recently, circuit dies have been encapsulated at the wafer level before slicing to produce a significantly smaller package. When a package has an area no more than 1.2 times the enclosed die, it is referred to as a Chip Scale Package (CSP). A Wafer Level CSP extends the wafer fabrication to include device interconnection and device protection processes to produce a package only slightly larger than the enclosed die.

FIG. 1 shows an elevated bottom perspective view of a typical WLCSP 10 according to the prior art. A wafer die 11 contains the device circuitry 12, which is visible through a transparent polymer protective coating that may be present on chip surface. An array of solder ball electrical contacts 13 (also referred to as "bumps") on the bottom surface of the WLCSP 10 connect the device circuitry 12 within the chip to an external circuit structure such as a circuit board.

As described above, the transparent polymer coating of the WLCSP 10 leaves the underlying device circuitry 12 visually observable to inspection, which may not be desirable. And the light that passes through the transparent polymer coating may adversely affect the operation of the device circuitry 12 within. In addition, the solder ball electrical contacts 13 are relatively fragile and can be damaged during shipping and handling. Similarly, the unencapsulated back side of the WLCSP 10 is susceptible to chipping.

SUMMARY OF THE INVENTION

Embodiments of the present invention are directed to an electronics package having a wafer die substrate which contains electronic circuits and which has a top surface and a bottom surface. A top protective layer is substantially thinner than the substrate and covers the top surface. A bottom protective layer is substantially thinner than the substrate and covers the bottom surface. Circuit contacts are distributed about the bottom protective layer for electrically coupling the substrate electronic circuits to external electronic circuits.

In further embodiments, the top and/or protective layer may be opaque. The wafer die substrate may further include side surfaces between the top and bottom surfaces, and at least one of the top protective layer and the bottom protective layer may be thicker at the side surfaces such that an exposed surface of the substrate at the side surfaces is substantially thinner than the rest of the substrate. Or, in a related embodiment, there may be no surface of the substrate exposed at the side surfaces.

In some embodiments, the circuit contacts may be based on an array of conductive bumps embedded in the bottom protective layer. Some specific embodiments may also include locking features in one of the wafer die surfaces for improving adhesion between the wafer surface and its associated protective layer.

Embodiments of the present invention also include a method of producing an electronics circuit package. In such a method, electronic circuits are fabricated in a wafer die substrate having a top surface and a bottom surface. The top surface is covered with a top protective layer substantially thinner than the substrate, and the bottom surface is covered with a bottom protective layer substantially thinner than the substrate. Circuit contacts are distributed about the bottom protective layer for electrically coupling the substrate electronic circuits to external electronic circuits.

In further such embodiments, the top and/or bottom protective layer may be opaque. The wafer die substrate may further include side surfaces between the top and bottom surfaces, and at least one of covering the top surface and covering the bottom surface may create a protective layer that is thicker at the side surfaces such that an exposed surface of the substrate at the side surfaces is substantially thinner than the rest of the substrate. Or, in a related embodiment, there may be no surface of the substrate exposed at the side surfaces.

In some embodiments, developing a plurality of circuit contacts may include embedding an array of conductive bumps in the bottom protective layer. In some specific embodiments, a plurality of locking features may be fabricated in at least one of the top surface and the bottom surface of the wafer die substrate for improving adhesion between the at least one of the top surface and the bottom surface and its associated protective layer.

DETAILED DESCRIPTION OF SPECIFIC EMBODIMENTS

Embodiments of the present invention are directed to techniques for fully or nearly fully encapsulating the planar surfaces of a Wafer Level Chip Scale Package (CSP). This is in contrast to current WLCSP's which have at least one planar surface that is not encapsulated. In addition, whereas in the prior art the circuit side planar surface may have a transparent encapsulation layer, in embodiments of the present invention the encapsulation layers may be substantially opaque, especially on the circuit side.

In one specific embodiment, an entire uncut wafer of circuit dies is encapsulated by a molding process which includes encapsulation of the metal interconnects that are attached to the bond pads. Once encapsulated, the molded wafer is then ground or etched to expose the interconnects, and then singulated into individual WLCSP components, e.g., by sawing.

Figure 1:
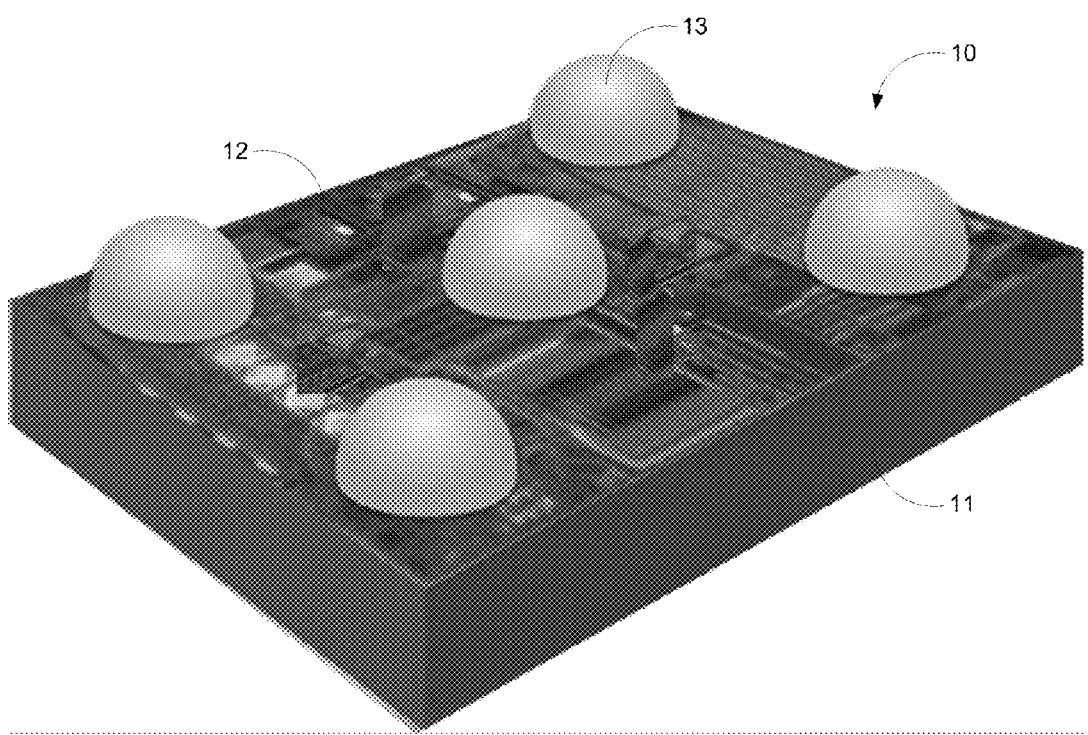
FIG. 1 shows an elevated bottom perspective view of a wafer level chip scale package according to the prior art.
Figure 2:
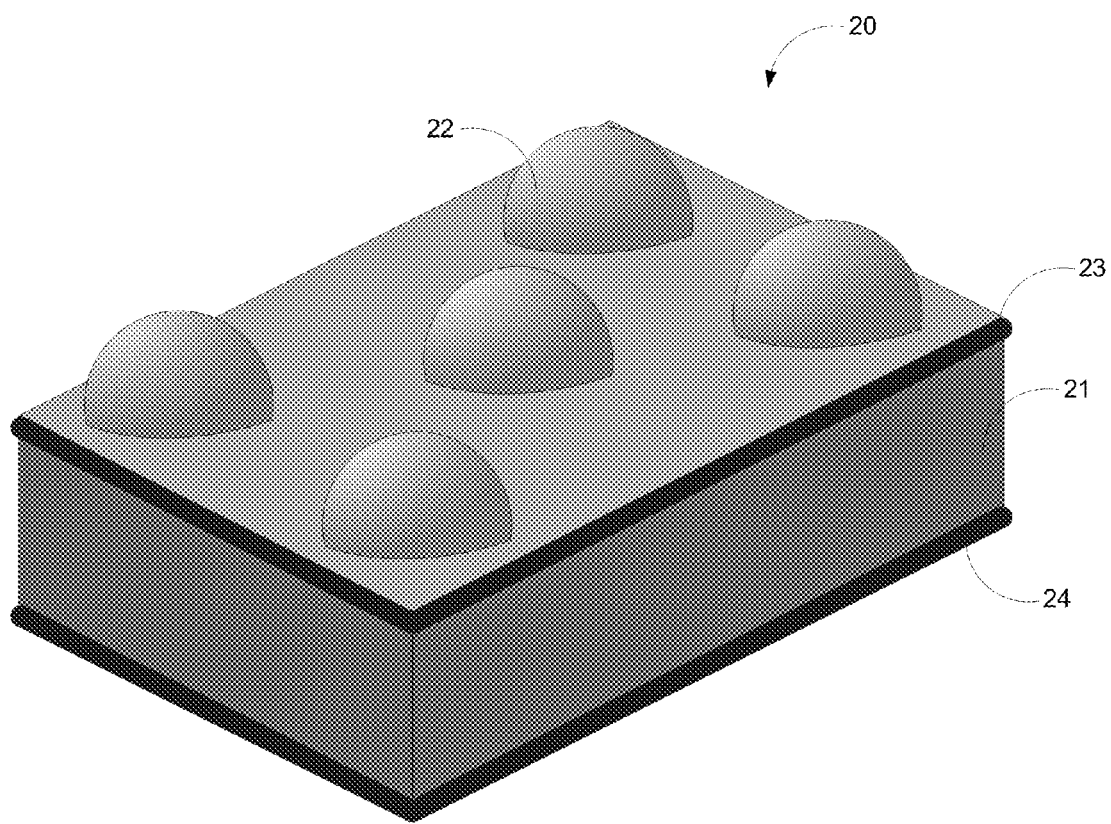
FIG. 2 shows an elevated bottom perspective view of a wafer level chip scale package according to an embodiment of the present invention.

FIG. 2 shows an elevated bottom perspective view of a wafer level chip scale package (WLCSP) 20 according to one specific embodiment of the present invention. The WLCSP 20 includes a wafer die substrate 21 which contains the electronic circuits of the device. Covering the bottom surface of the substrate 21 is a bottom protective layer 23 of encapsulation material which is substantially thinner than the substrate. Covering the top surface of the substrate 21 is a similar top protective layer 24 of encapsulation material which is substantially thinner than the substrate. Circuit contacts 22 (e.g., made of solder, gold, copper, etc.) are distributed about the bottom protective layer 23 for electrically coupling the substrate electronic circuits to external electronic circuits.

Figure 3:
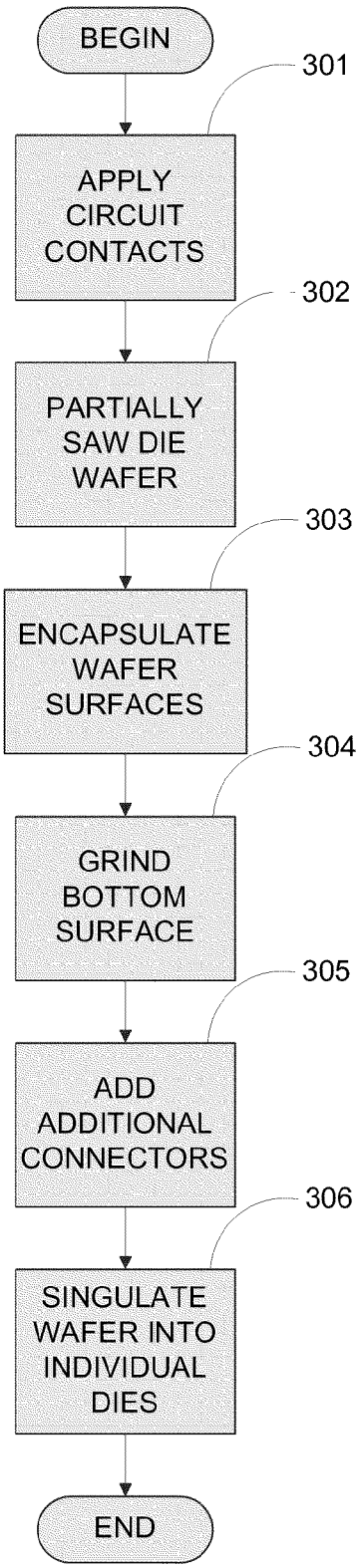
FIG. 3 is flow chart showing various logical steps in a process to produce wafer level chip scale packages according to an embodiment.
Figure 4A:
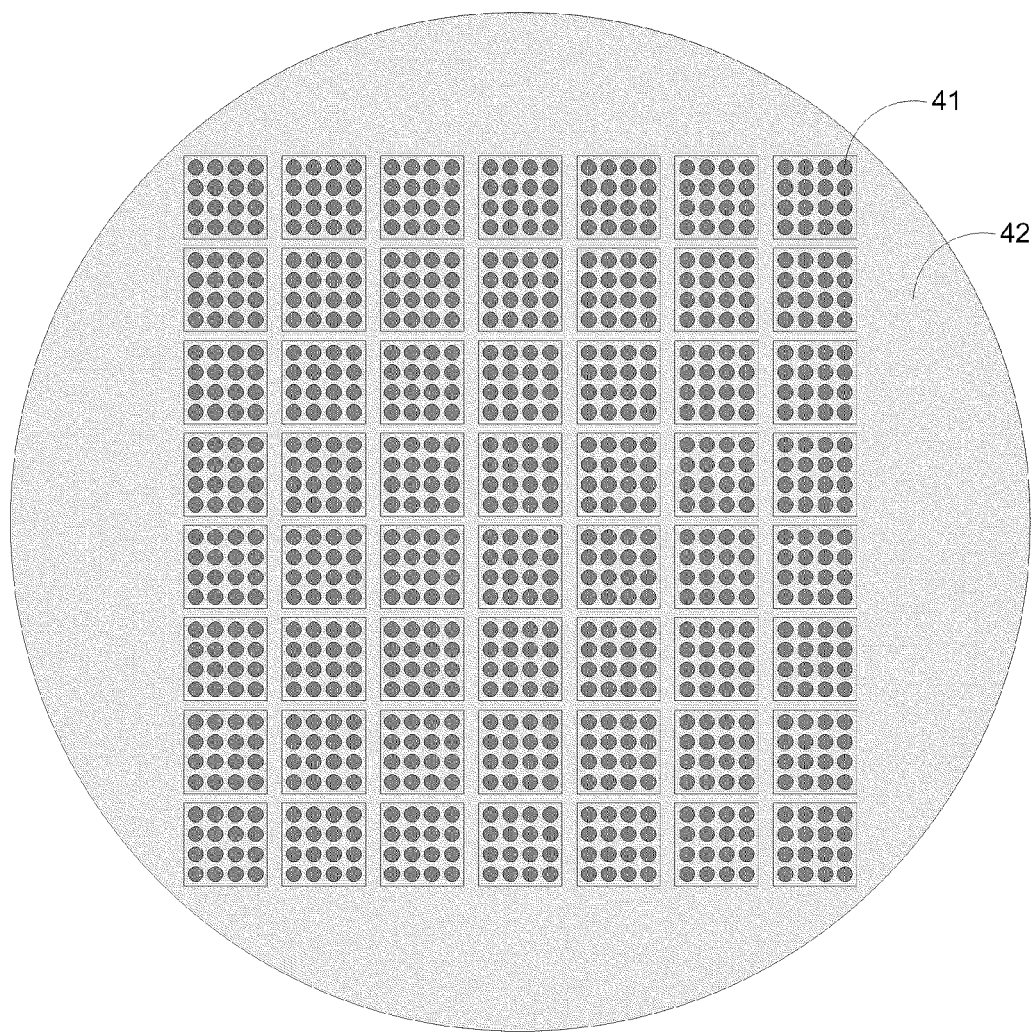
FIG. 4A shows a top plan view and FIG. 4B shows a side cross-sectional view of application of electrical contacts to circuits on a die wafer.
Figure 4B:
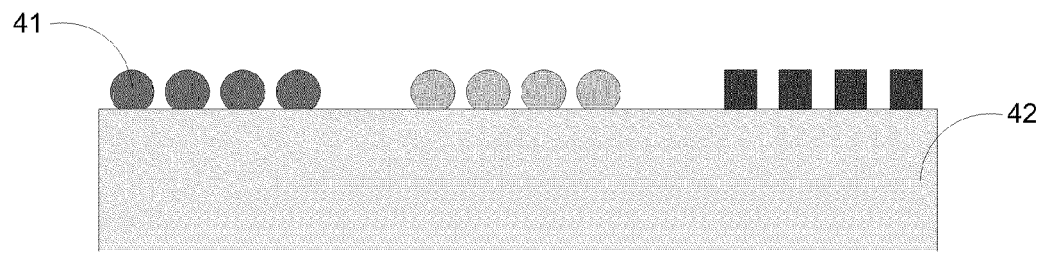

FIG. 3 is flow chart showing various logical steps in a process to produce a wafer level chip scale package (WLCSP) according to an embodiment. As shown in FIG. 4 A-B, once the electronic circuits have been fabricated on a wafer 42, device interconnects are applied, step 301, in the form of arrays of circuit contacts 41 which are attached to bond pads within the circuits. The circuit contacts 41 may be any electrically conductive material of adequate strength for physical connecting, including without limitation, solder, gold, silver, copper, etc., and may have various specific forms such as spherical, cylindrical, etc., and may be connected by any of the known techniques such as solder print, plating, wirebond, etc.

Figure 5A:
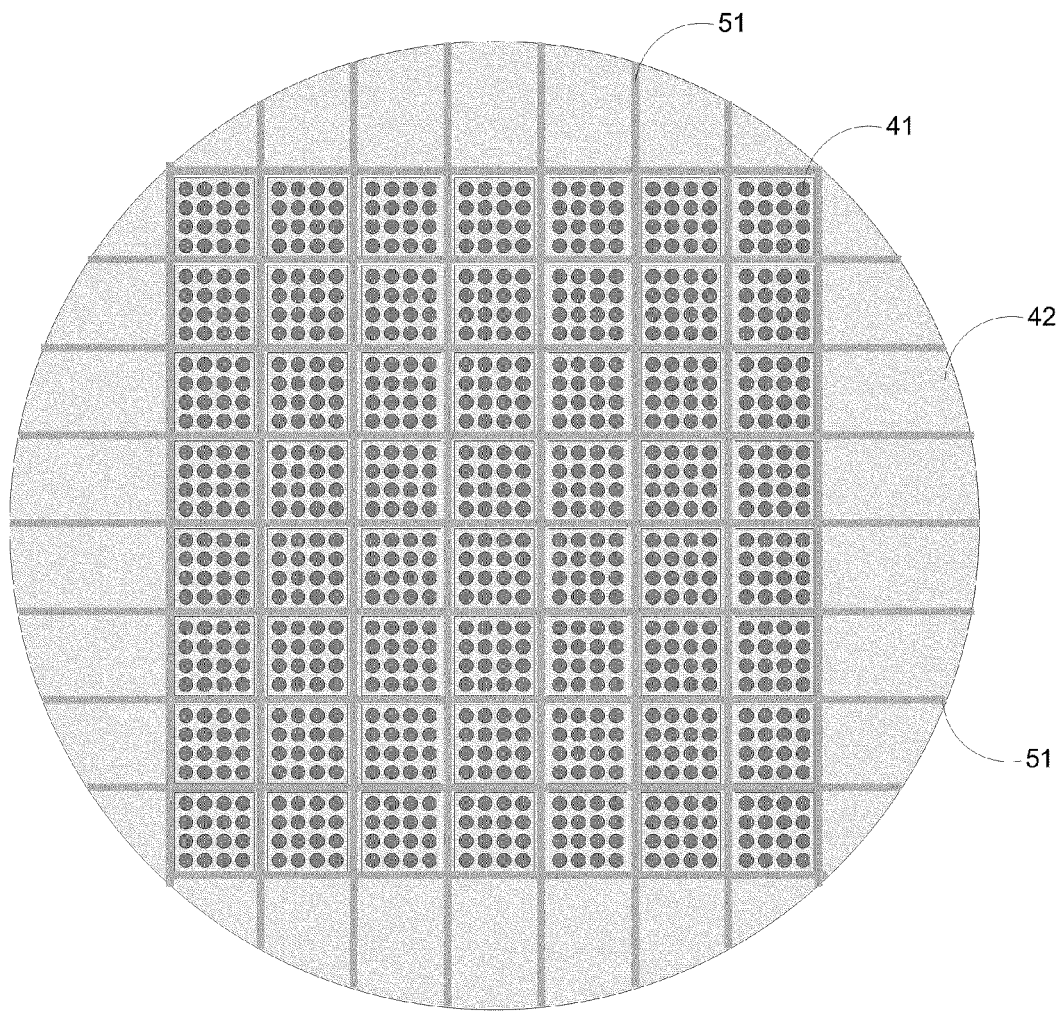
FIG. 5A shows a top plan view and FIG. 5B shows a side cross-sectional view of partial sawing of the die wafer.
Figure 5B:
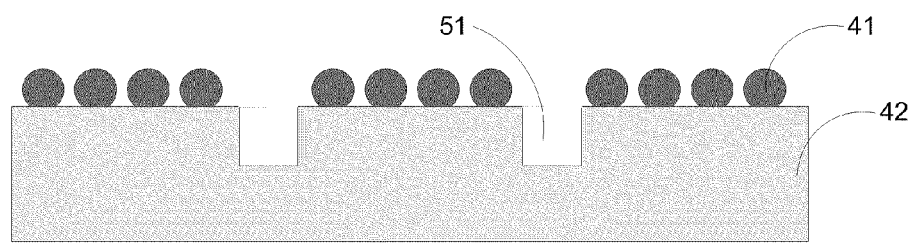

In some specific embodiments, the next step 302 is to partially saw the die wafer 42 to create kerf slots 51 in the wafer material 42 which initially separate the individual die circuits, as shown in FIG. 5 A-B. Besides mechanical sawing, other specific processes may be used for the partial sawing, step 302, including without limitation approaches based on laser sawing, chemical etching, and the like.

Figure 6A:
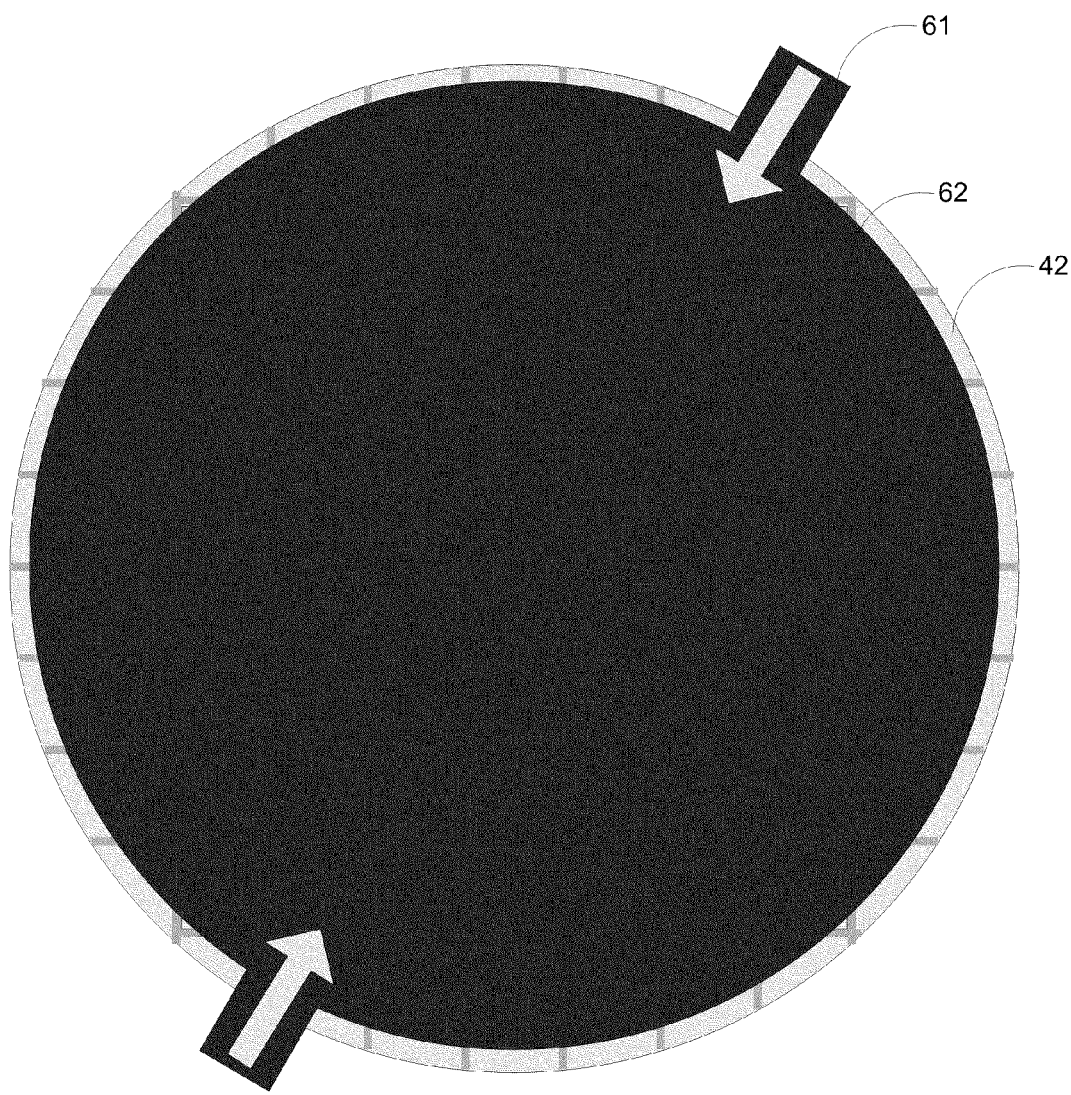
FIG. 6A shows a top plan view and FIG. 6B shows a side cross-sectional view of encapsulation of the die wafer.
Figure 6B:
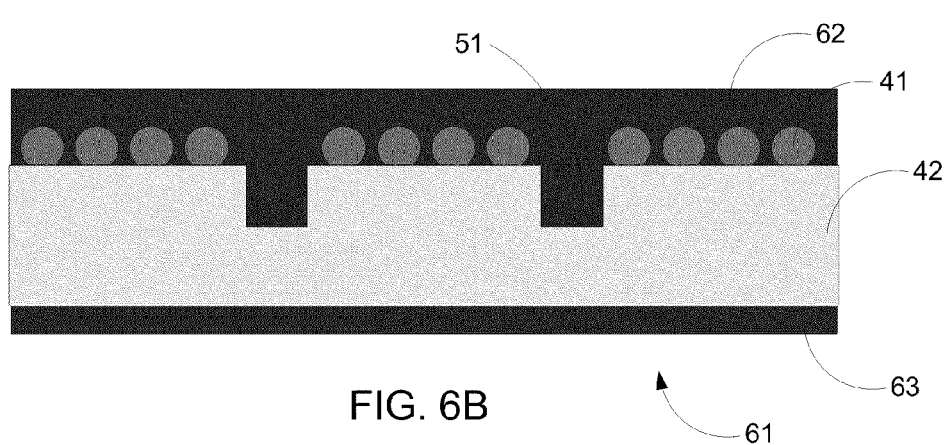

After the partial sawing of kerf slots 51, encapsulation material 61 is molded over the top and bottom surfaces of the wafer 42, step 303, as shown in FIG. 6 A-B. The encapsulation may be any of various electrically insulating materials, e.g., an opaque moldable polymer such as a polyimide. After encapsulation, the kerf slots 51 contain a substantially thicker layer of encapsulation material 61 than for the rest of the wafer material 42 where the electronic circuit for each device is located.

Figure 7A:
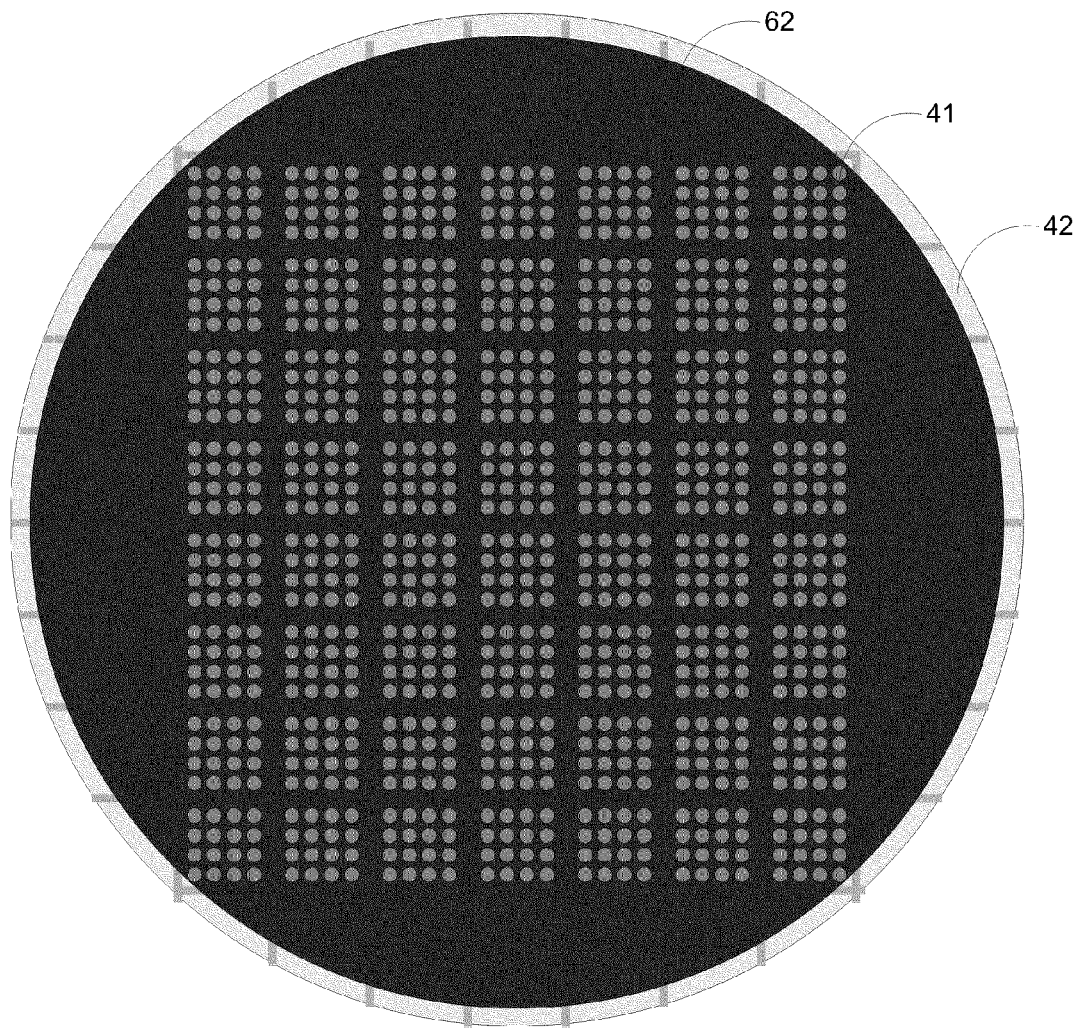
FIG. 7A shows a top plan view and FIG. 7B shows a side cross-sectional view of grinding of the bottom encapsulating layer to expose the circuit contacts.
Figure 7B:
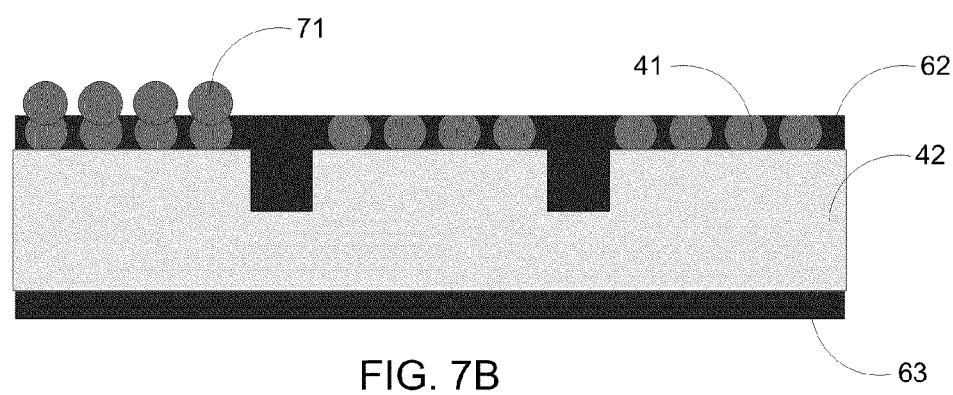

In the embodiment shown in FIG. 6 A-B, the bottom protective layer 62 of encapsulation material 61 completely covers the circuit contacts 41. In that case, the next step 304 is to thin the bottom protective layer 62 as shown in FIG. 7 A-B, e.g., by grinding or etching, so as to expose a portion of the circuit contacts 41 for external connection. In other embodiments, the bottom protective layer 62 of encapsulation material 61 does not initially completely cover the circuit contacts 41, but rather leaves a portion of the circuit contacts exposed. In either case, it may be useful to add another layer of circuit connectors 71, step 305, over the exposed portion of circuit connectors 41.

Figure 8A:
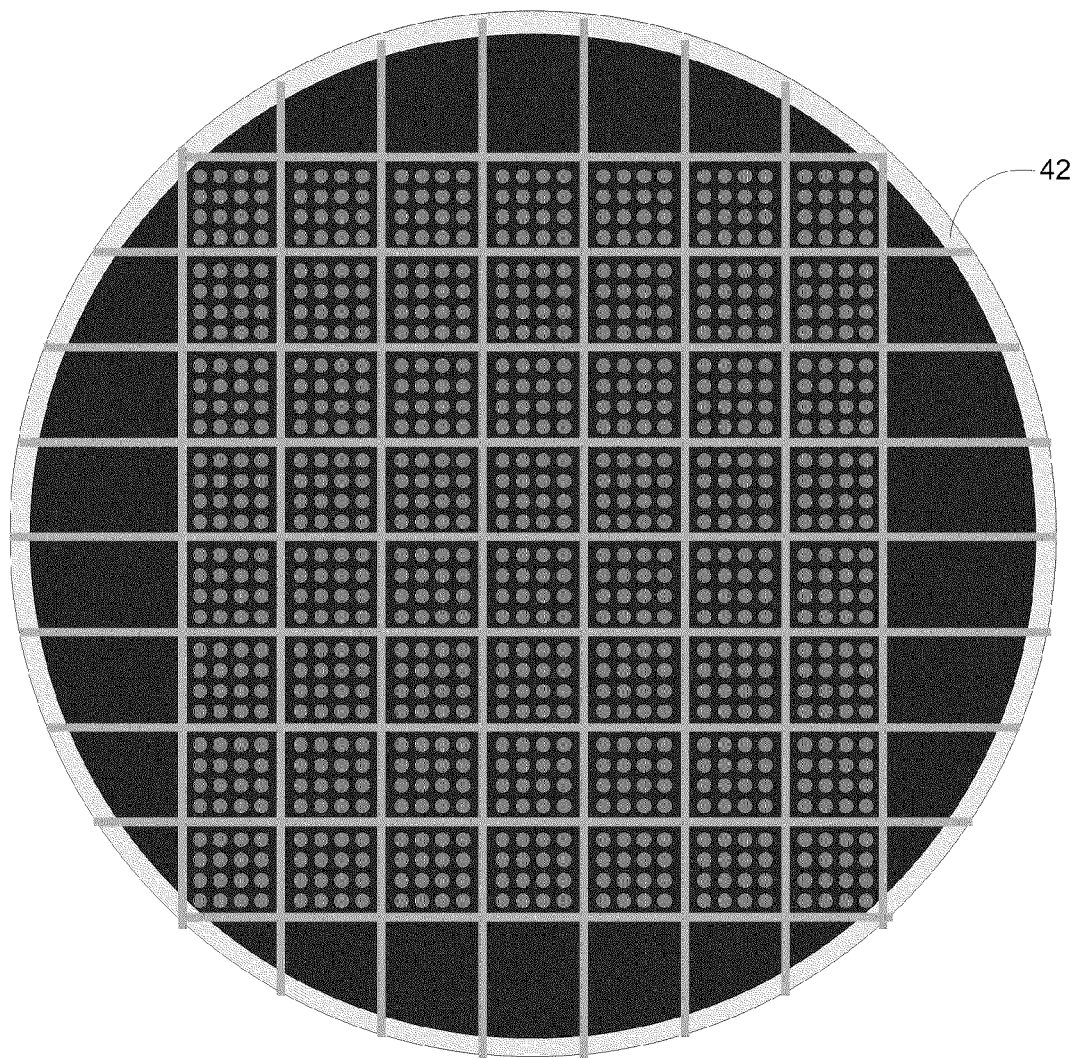
FIG. 8A shows a top plan view and FIG. 8B shows a side cross-sectional view of singulating the wafer into individual die chips.
Figure 8B:
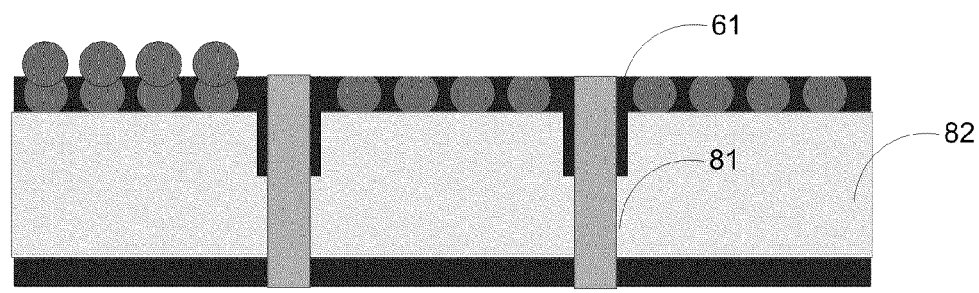

Then, the wafer is singulated into individual WLCSP's, step 306. As can be seen in FIG. 8 A-B, the cut used for singulating is narrower than the cut used in the earlier partial sawing step. As a result, at the side edges 81 of the individual dies 82, the encapsulation material 61 is substantially thicker than the wafer substrate material as a whole. Thus, only a reduced thickness of the wafer material is exposed at the side edges 81 of the individual dies 82. This aspect of reduced exposure of wafer material at the device side edges 81 decreases the effects of light on the interior electronic circuits and increases the physical integrity of the individual dies 82.

Figure 9D:
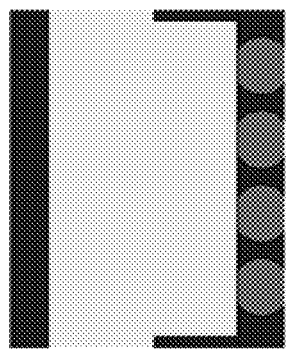
FIG. 9D shows an individual WLCSP in which both the active side and back side of the wafer received partial saw cuts that essentially meet
Figure 9C:
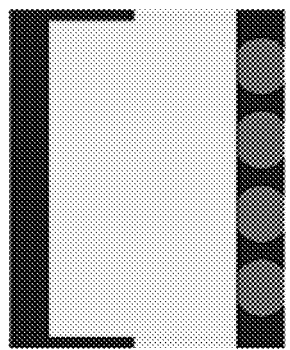
FIG. 9C shows an individual WLCSP in which both the active side and back side of the wafer received partial saw cuts and thicker layers of encapsulation material are on both sides of the device so as to minimally expose the wafer substrate.
Figure 9B:
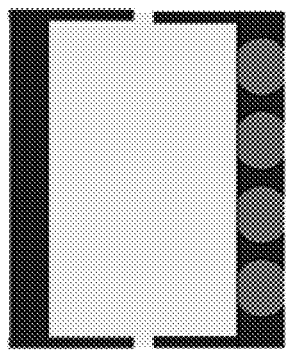
FIG. 9B shows an individual WLCSP in which the partial saw cut and thicker layer of encapsulation material is on the back (non-connector) side of the device.
Figure 9A:
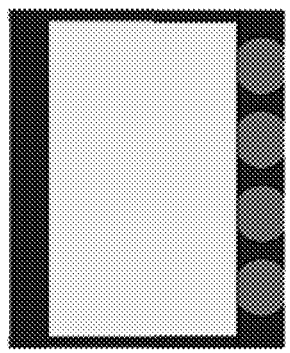
FIGS. 9A shows an individual WLCSP in which the partial saw cut and thicker layer of encapsulation material is on the active side of the device.

FIG. 9A-D shows examples of WLCSP's according to various specific embodiments of the present invention. FIG. 9A shows an individual WLCSP in which the partial saw cut and thicker layer of encapsulation material is on the active (connector) side of the device. FIG. 9B shows an individual WLCSP in which the partial saw cut and thicker layer of encapsulation material is on the back (non-connector) side of the device. FIG. 9C shows an individual WLCSP in which both the active side and back side of the wafer received partial saw cuts and thicker layers of encapsulation material are on both sides of the device so as to minimally expose the wafer substrate. And FIG. 9D shows an individual WLCSP in which both the active side and back side of the wafer received partial saw cuts that essentially meet (leaving the initial wafer perforated, e.g., only connected at the die corners) so that when the encapsulation material is molded over the wafer, the encapsulation material at the side edges of the individual dies flows together to meet so that little or no wafer material is exposed at the side edges of the individual dies.

Figure 10A:
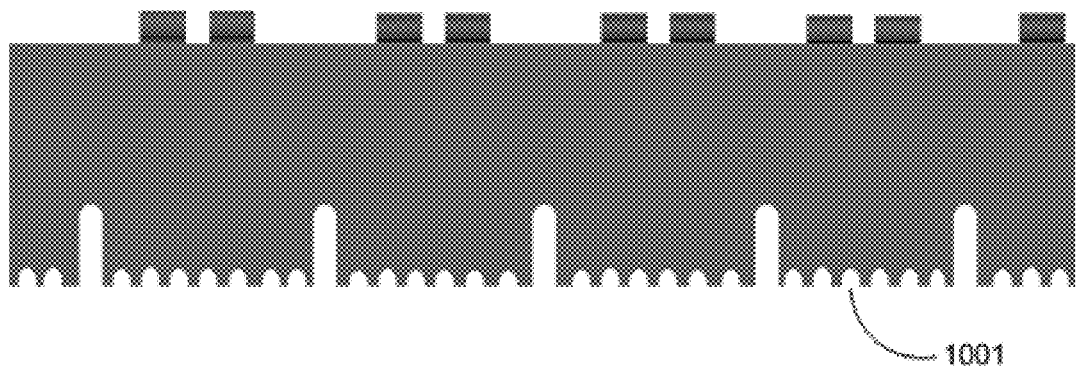
FIG. 10A-B shows an embodiment in which the wafer backside and/or the partially sawn kerf slots are micro-etched with encapsulant locking features.
Figure 10B:

In further specific embodiments, various additional fabrication steps may be used, for example, to improve adherence of the encapsulation material to the devices. FIG. 10A-B shows features of an embodiment in which the wafer backside are micro-etched with encapsulant locking features 1001. The locking features 1001 may be a series of grooves, slots, or other surface features that may be developed on the backside of the wafer by various means such as micro-etching, laser etching, molding, etc. As seen in FIG. 10B, the partially sawn kerf slots may also or alternatively have similar slot locking features 1002. In such embodiments, when the encapsulation material is applied over the partially sawn wafer, it flows into the locking features 1001 and/or 1002. Once the encapsulation material solidifies, the physical connection between the wafer material and the encapsulation material is increased by the interaction between the encapsulation material and the locking features 1001 and 1002.

Although various exemplary embodiments of the invention have been disclosed, it should be apparent to those skilled in the art that various changes and modifications can be made which will achieve some of the advantages of the invention without departing from the true scope of the invention.

What is claimed is:

1. An electronics package comprising:
    a die of a wafer level chip scale package (WLCSP) including a die substrate containing electronic circuits and having a top surface and a bottom surface;
    a single continuous protective layer substantially thinner than the substrate and completely covering the top and bottom surfaces to prevent visual observation of the underlying electronic circuits;
    a plurality of regular repeating locking features fabricated in and extending entirely across at least one of the top surface and the bottom surface of the wafer die substrate including a center area thereof for providing a locking interaction connection to improve adhesion between the at least one of the top surface and the bottom surface and the protective layer; and
    a plurality of circuit contacts distributed about the bottom protective layer for electrically coupling the substrate electronic circuits to external electronic circuits.

2. An electronics package according to claim 1, wherein the wafer die substrate further includes side surfaces between the top and bottom surfaces, and wherein the protective layer is thicker at the side surfaces such that no surface of the substrate is exposed at the side surfaces.

3. An electronics package according to claim 1, wherein the circuit contacts are based on an array of conductive bumps embedded in the bottom protective layer.

4. An electronics package according to claim 1, wherein the protective layer is visually opaque.

5. An electronics package comprising:
    a die of a wafer level chip scale package (WLCSP) including a die substrate containing electronic circuits and having a top surface and a bottom surface;
    a single continuous surface protective means substantially thinner than the substrate and covering the top surface and the bottom surface to prevent visual observation of the underlying electronic circuits;
    regular repeating locking feature means fabricated in and extending entirely across at least one of the top surface and the bottom surface of the wafer die substrate including a center area thereof for providing a locking interaction connection to improve adhesion between the at least one of the top surface and the bottom surface and its associated protective means; and
    a plurality of circuit contact means distributed about the bottom protective layer for electrically coupling the substrate electronic circuits to external electronic circuits.

6. An electronics package according to claim 5, wherein the wafer die substrate further includes side surfaces between the top and bottom surfaces, and wherein the protective means is thicker at the side surfaces such that no surface of the substrate is exposed at the side surfaces.

7. An electronics package according to claim 5, wherein the plurality of circuit contact means includes an array of conductive bumps in the bottom protective means.

8. An electronics package according to claim 5, wherein the protective layer is visually opaque.

* * * * *